United States Patent [19]

Tominari

[11] Patent Number: 4,644,517
[45] Date of Patent: Feb. 17, 1987

[54] AUDIO SIGNAL AMPLIFIER FOR AN ELECTROMAGNETIC PHONO CARTRIDGE

[75] Inventor: Noboru Tominari, Tokyo, Japan
[73] Assignee: Dynavector, Inc., Japan
[21] Appl. No.: 734,395
[22] Filed: May 14, 1985
[30] Foreign Application Priority Data
  Mar. 8, 1985 [JP] Japan .................................. 60-46278
[51] Int. Cl.$^4$ .............................................. G11B 3/00
[52] U.S. Cl. ................................................... 369/134
[58] Field of Search ............... 369/128, 134; 330/188, 330/189, 190; 360/65, 67

[56] References Cited
U.S. PATENT DOCUMENTS
4,470,020 9/1984 Mohr .................................... 360/67

Primary Examiner—Donald McElheny, Jr.
Attorney, Agent, or Firm—Andrus, Sceales, Starke & Sawall

[57] ABSTRACT

An audio signal amplifier for an electromagnetic transducer, comprises a transformer which has a primary winding coupled to the electromagnetic transducer for receiving an output audio signal from the electromagnetic transducer and a secondary winding for producing a transformed audio signal as an output. The transformer has a turn ratio of the primary winding and the secondary winding which is selected to n:1, where n is a real number greater than 1. The audio signal amplifier further comprises a current-voltage conversion circuit which is coupled to the secondary winding of the transformer for converting an audio signal current from the secondary winding into an audio signal voltage.

5 Claims, 6 Drawing Figures

AUDIO SIGNAL AMPLIFIER FOR AN ELECTROMAGNETIC PHONO CARTRIDGE

BACKGROUND OF THE INVENTION

The present invention generally relates to audio signal amplifiers, and more particularly to an audio signal amplifier for obtaining an output audio signal from an electromagnetic transducer as a signal current as large as possible and for amplifying the obtained audio signal.

Generally, as pick-up cartridges used in record players, there are electromagnetic type pick-up cartridges such as the moving iron (MI) type, and moving coil (MC) type, and moving magnet (MM) type. Conventionally, an audio signal obtained from such an electromagnetic type pick-up cartridge is supplied to a preamplifier for voltage amplification. Particularly, in the case of the MC type pick-up cartridge which produces an output voltage in the order of 1/10 the output of the MI type or MM type pick-up cartridge, the output audio signal is stepped up by approximately 10 times by a stepup transformer or a head amplifier, before the output audio signal is supplied to the preamplifier for further voltage amplification.

Thus, the output audio signal produced from the above mentioned electromagnetic type pick-up cartridge is conventionally subjected to a direct voltage amplification. As a result, the output audio signal is affected by a magnetic non-linear characteristic inherent to the electromagnetic type pick-up cartridge, and there are problems in that the audio signal is distorted especially in the low frequency range and the tone quality is deteriorated.

SUMMARY OF THE INVENTION

Accordingly, it is a general object of the present invention to provide a novel and useful audio signal amplifier in which the problems described heretofore are eliminated.

Another and more specific object of the present invention is to provide an audio signal amplifier in which an output audio signal current of an electromagnetic transducer is supplied to a primary winding of a transformer, and an audio signal current produced from a secondary winding of the transformer is supplied to a current-voltage conversion circuit. A stepdown type transformer in which the number of turns in the primary winding is larger than that in the secondary winding is used as the transformer. Thus, the internal resistance of the electromagnetic transducer side as viewed from the secondary winding side of the transformer becomes apparently smaller. Further, due to a theoretical zero input impedance which is a specific feature of a current amplifier, both ends of the secondary winding of the transformer assume a shorted state, and the audio signal current supplied to the current-voltage conversion circuit becomes large. When it is assumed that the turn ratio of the primary winding and the secondary winding is equal to n:1, the current sensitivity becomes approximately $n^2$ times. Accordingly, the effect of the magnetic non-linear characteristic of the electromagnetic transducer is significantly reduced in the low frequency range, and the distortion of the output signal is reduced to improve the quality of the output signal.

Other objects and further features of the present invention will be apparent from the following detailed description when read in conjunction with the accompanying drawings.

DETAILED DESCRIPTION

Figure 1:
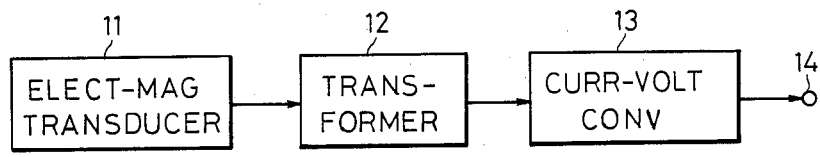
FIG. 1 is a system block diagram showing in principle an audio signal amplifier according to the present invention.

In FIG. 1, an electromagnetic transducer 11 is an electromagnetic type pick-up cartridge for phonographs, for example. A stylus tip provided at a tip end of a cantilever slidingly traces a sound groove on a record disc, and an output audio signal is produced by generation by varying the magnetic flux of a magnetic circuit in response to the mechanical vibration of the cantilever.

The output audio signal of the electromagnetic transducer 11 is supplied to a primary winding of a transformer 12. In the transformer 12, the turn ratio of the primary winding and a secondary winding is selected to n:1, where n is a real number greater than 1. Therefore, a current is so transformed that the audio signal current flowing through the secondary winding becomes larger than the audio signal current flowing through the primary winding. The audio signal current obtained from the secondary winding of the transformer 12 is supplied to a current-voltage conversion circuit 13 wherein the current is converted into an audio signal voltage. The converted audio signal voltage is obtained through an output terminal and is supplied to an amplifier circuit in the following stage.

Figure 2A:
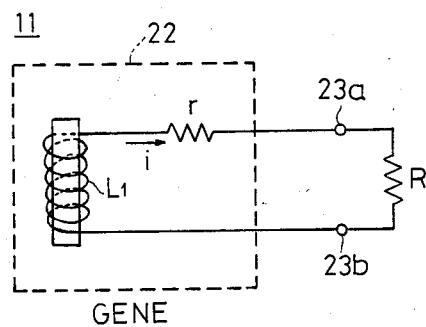
FIGS. 2A and 2B respectively are diagrams for explaining the electromagnetic transducer shown in FIG. 1.

In the electromagnetic transducer 11 shown in FIG. 2A, when a magnetic field Hin in which a generation part 22 constituted by a coil $L_1$, an iron piece 21 and the like is disposed, is varied, a magnetic flux $\phi$ which passes through the iron piece 21 varies, and a voltage proportional to the time differential ($d\phi/dt$) of the flux $\phi$ is generated across the terminals of the coil $L_1$. As a result, a current i flows through an internal resistance r of the generation part 22 of the electromagnetic transducer 11 and a load resistor R which is connected to the generation part 22 through terminals 23a and 23b. However, when the current i flows through the coil $L_1$, a magnetic field Hb which acts in a direction so as to prevent the variation of the magnetic field Hin is generated. In other words, the magnetizing force acting on the iron piece 21 is equal to Hin−Hb. The relationship between the magnetizing force (Hin−Hb) and the magnetic flux $\phi$ which passes through the iron piece 21 is non-linear. When this non-linear relationship is represented by $G_N$, the electromagnetic transducer 11 can be represented by a block diagram in FIG. 2B.

Figure 2B:
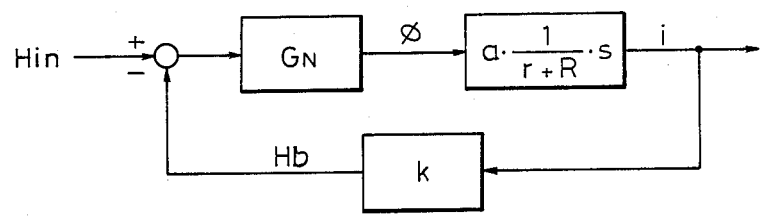

In FIG. 2B, a proportional constant of an equation which describes the generation of the current i by the magnetic flux $\phi$ is represented by a, a Laplace operator of d/dt is represented by s, and a proportional constant of an equation which describes the generation of the magnetic field Hb by the current i is represented by k.

From FIG. 2B, the relationship between the magnetic field Hin and the magnetic flux $\phi$ can be described by the following equation (1).

$$\phi/Hin = G_N/[1 + G_N \cdot k \cdot \{a/(r+R)\} \cdot s] \quad (1)$$

When the condition (2) is satisfied, the following equation (3) can be obtained from the equation (1).

$$|G_N \cdot k \cdot a \cdot s/(r+R)| >> 1 \quad (2)$$

$$\phi/Hin \approx 1/[k \cdot \{a/(r+R)\} \cdot s] \quad (3)$$

Thus, the relationship between the magnetic field Hin and the magnetic flux $\phi$ becomes linear. Next, when the condition (2) is considered in terms of the frequency range, the following condition (4) is obtained from the condition (2) when $s = j\omega$ is substituted into the condition (2).

$$\omega >> (r+R)/(G_N \cdot k \cdot a) \quad (4)$$

That is, when the angular frequency $\omega$ satisfies the condition (4), the equation (3) stands and the relationship between the magnetic field Hin and the magnetic flux $\phi$ becomes linear. As a result, the signal is not affected by the non-linear relationship $G_N$. Thus, it may be understood that the frequency of the signal which is affected by the non-linearity becomes lower as the internal resistance r and the load resistance R become smaller.

The internal resistance r of a general electromagnetic type pick-up cartridge is in the order of 500Ω. The input resistance of a standard preamplifier is approximately equal to 50kΩ. Therefore, in the conventional case where the output audio signal of the electromagnetic type pick-up cartridge is directly subjected to a voltage amplification, the resistance (r+R) becomes equal to 50.5kΩ.

Figure 3A:
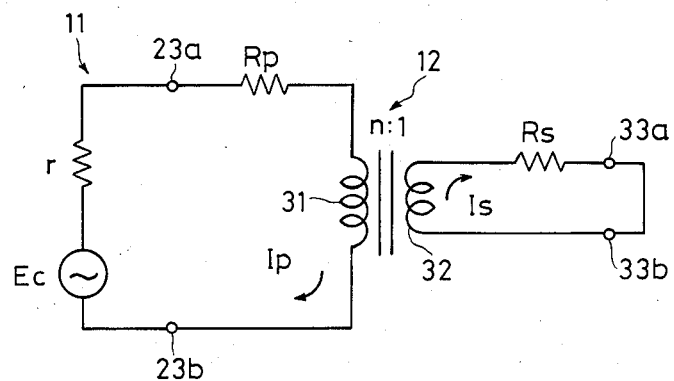
FIGS. 3A and 3B respectively are equivalent circuit diagrams showing the electromagnetic transducer and a transformer shown in FIG. 1.

FIG. 3A shows an equivalent circuit diagram of the electromagnetic converter 11 and the transformer 12. In this circuit diagram, the electromagnetic converter 11 is represented as a voltage signal source Ec having the internal resistance r. The ends of a primary winding 31 of the transformer 12 are connected to the output terminals 23a and 23b of the electromagnetic transducer 11. The internal resistance of this primary winding 31 is represented by Rp and the current which flows through the primary winding 31 is represented by Ip. Further, the internal resistance of a secondary winding 32 of the transformer 12 is represented by Rs and the current flowing through the secondary winding 32 is represented by Is. Both ends 33a and 33b of the secondary winding 32 are short-circuited so that a maximum value for the current Is can be obtained. Assuming that the transformer 12 is an ideal transformer, the current Is which flows through the secondary winding 32 can be described by the following equation (5).

$$Is = n \cdot Ec/(Rp + r + n^2 \cdot Rs) \quad (5)$$

A turn ratio n with which a maximum value for the current Is is obtainable, can be obtained from the following equation (6).

$$dIs/dn = [(Rp+r) - n^2 \cdot Rs]/(Rp+r+n^2 \cdot Rs)^2 \quad (6)$$

The following equation (7) can be obtained from the equation (6).

$$n = \sqrt{(Rp + r)/Rs} \quad (7)$$

The current Is assumes the maximum value when the equation (7) is satisfied, and the maximum current Is can be described by the following equation (8).

$$Is = Ec/[2\sqrt{(Rp + r) \cdot Rs}] \quad (8)$$

Thus, an equivalent internal resistance re of the electromagnetic transducer 11 and the transformer 12 as a whole, can be described by the following equation (9).

$$re = 2\sqrt{(Rp + r) \cdot Rs} \quad (9)$$

Figure 3B:
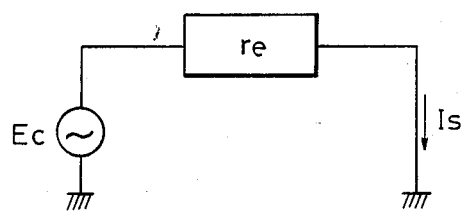

Therefore, the circuit shown in FIG. 3A can be replaced by an equivalent circuit shown in FIG. 3B.

For example, it will be assumed that the internal resistance r is approximately equal to 500Ω, the internal resistance Rp of the primary winding 31 is equal to 200Ω, and the internal resistance Rs of the secondary winding 32 is equal to 2Ω. Further, the inductance of the transformer 12 is not considered for the sake of simplicity. In this case, the turn ratio n with which a maximum value for the current Is is obtainable is equal to 18.7 from the equation (7). From the equation (9), the equivalent internal resistance re is approximately equal to 75Ω. In this way, by the use of the transformer 12, the internal resistance r (=500Ω) is reduced to the equivalent internal resistance re (=75Ω), and the current Is assumes a large value which is approximately 6 times the current Ip. Generally, it can be said that the current Is which is $r/2\sqrt{(Rp+r) \cdot Rs}$ times the current Ip flowing through the primary winding 31, can be obtained from the secondary winding 32 of the transformer 12.

Figure 4:
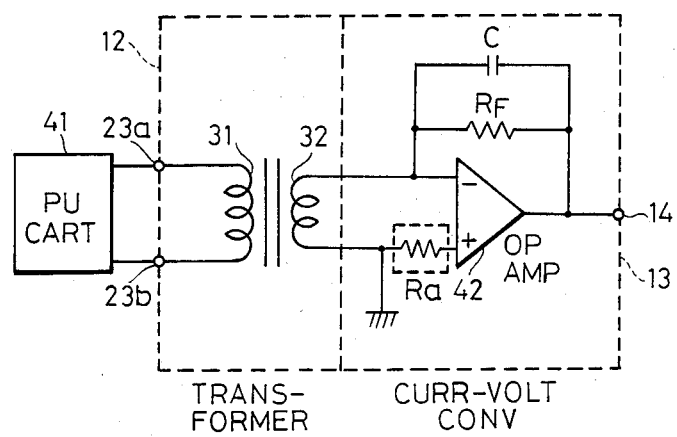
FIG. 4 is a circuit diagram showing an embodiment of a concrete circuit of the block system shown in FIG. 1.

FIG. 4 shows an embodiment of a concrete circuit of the block system shown in FIG. 1. An electromagnetic type pick-up cartridge 41 is connected to the ends of the primary winding 31 of a transformer 12, through the terminals 23a and 23b. The turn ratio of the primary winding 31 and the secondary winding 32 of the transformer 12 is equal to n:1. An operational amplifier 42 of the current-voltage conversion circuit 13 is connected to the secondary winding 32 of the transformer 12. A non-inverting input terminal of the operational amplifier 42 is grounded directly or is grounded through a resistor Ra indicated by a phantom line in FIG. 4. A resistor $R_F$ and a capacitor C which is connected in parallel to the resistor $R_F$ are connected between an output terminal and an inverting input terminal of the operational amplifier 42. The capacitor C is provided to prevent oscillation, and may be omitted. The inverting input terminal of the operational amplifier 42 is in a state of imaginal short, and it is therefore possible to regard the current Is as the only current flowing through the resistor $R_F$, irrespective of the magnitude of the load connected to the output terminal 14. Thus, an output voltage Vo (Vo= $-Is \cdot R_F$) is obtained as a result.

By appropriately selecting the resistance of the resistor $R_F$, it is possible to obtain an output voltage Vo having a desired value which is larger than the output voltage of the signal source Ec. It is obvious that a voltage amplifier may be further connected to the output terminal according to the needs. One end of the secondary winding 32 of the transformer 12 is grounded, and the other end of the secondary winding 32 is connected to the inverting input terminal of the operational amplifier 42, which inverting input terminal is in the state of imaginal short. For this reason, the load resistance of the secondary winding 32 becomes substantially equal to zero, and the ends of the secondary winding 32 can be regarded as being short-circuited.

Accordingly, in the circuit of the present invention, it is possible to regard the internal resistance r (for example, 500Ω) in FIG. 2A as being equivalent to the resistance re (for example, 75Ω). In addition, since the load resistance R is substantially equal to zero, the resistance (r+R) in the equation (4) becomes equal to 75Ω, for example. This value for the resistance (r+R) is considerably small compared to the resistance (r+R) (for example, 50.5kΩ) obtained according to the convenitional voltage amplification system. In the case where the output current i is supplied directly to the current-voltage conversion circuit 13 without passing the circuit i through the intervening transformer 12, the load resistance R is substantially equal to zero, and the resistance (r+R) in the equation (4) becomes equal to 500Ω, for example. This value for the resistance (r+R) is large compared to the resistance of 75Ω in the circuit of the present invention. Furthermore, in this case, the current i is only in the order of 1/6 the current Is in the circuit of the present invention. Therefore, the advantage of using the transformer 12 in the circuit of the present invention may be readily understood.

According to the circuit of the present invention, the resistance (r+R) is extremely small, and for the above described reasons, the frequency of the signal which is affected by the non-linear characteristic of the electromagnetic transducer 11 is significantly lowered. As a result, the non-linear distortion of the audio signal in the low frequency range is greatly reduced and the tone quality is improved.

In the circuit of the present invention, the type of the electromagnetic transducer 11 is not limited to the electromagnetic type pick-up cartridge 41, but it is possible to use an electromagnetic type microphone such as the moving coil type, moving magnet type, and the like, or a magnetic head for playing a magnetic tape or a magnetic disc.

As described heretofore, since the audio signal amplifier of the present invention comprises the transformer and the current-voltage conversion circuit, it is possible to significantly decrease the apparent internal resistance and the apparent load resistance of the electromagnetic transducer. As a result, the frequency of the audio signal which is affected by the non-linear characteristic is significantly lowered. Hence, the non-linear distortion of the audio signal is reduced, and the tone quality is improved.

Further, the prevent invention is not limited to these embodiments but various variations and modifications may be made without departing from the scope of the invention.

What is claimed is:

1. An audio signal amplifier for an electromagnetic transducer, said audio signal amplifier comprising:
   a transformer comprising a primary winding coupled to said electromagnetic transducer for receiving an output audio signal of said electromagnetic transducer and a secondary winding for producing a transformed audio signal as an output, said transformer having a turn ratio of the primary winding and the secondary winding selected to n:1, where n is a real number greater than 1; and
   a current-voltage conversion circuit coupled to the secondary winding of said transformer for converting an audio signal current from said secondary winding into an audio signal voltage.

2. An audio signal amplifier as claimed in claim 1 in which the value of n in the turn ratio of said transformer is selected to satisfy an equation $n=\sqrt{(Rp+r)/Rs}$, where Rp represents the internal resistance of the primary winding of said transformer, Rs represents the internal resistance of the secondary winding of said transformer, and r represents the internal resistance of said electromagnetic transducer, respectively.

3. An audio signal amplifier as claimed in claim 2 in which an audio signal current which is $r/2\sqrt{(Rp+r)\cdot Rs}$ times the audio signal current flowing through the primary winding is obtained from the secondary winding of said transformer.

4. An audio signal amplifier as claimed in claim 1 in which said current-voltage conversion circuit comprises an operational amplifier having an inverting input terminal thereof coupled to an end of the secondary winding of said transformer, a feedback resistor coupled between an output and said inverting input terminal of said operational amplifier, and a non-inverting input terminal grounded directly or grounded through a resistor, the other end of the secondary winding of said transformer being grounded.

5. An audio signal amplifier as claimed in claim 4 in which said current-voltage conversion circuit further comprises a capacitor coupled in parallel to said feedback resistor between the output and said inverting input terminal of said operational amplifier.

* * * * *